United States Patent [19]

Yamada et al.

[11] Patent Number: 5,051,373
[45] Date of Patent: Sep. 24, 1991

[54] METHOD OF FABRICATING MMIC SEMICONDUCTOR INTEGRATED CIRCUITS USING THE RF AND DC MEASUREMENTS OF AN ACTIVE DEVICE ON A SUBSTRATE TO DESIGN THE PASSIVE ELEMENTS, WHICH ARE THEN E-BEAM WRITTEN TO THE SUBSTRATE

[75] Inventors: Takashi Yamada, Kyoto; Akihito Nagamatsu, Osaka; Seiichi Bamba, Kyoto; Tetsuro Sawai, Osaka; Haruo Nakano, Osaka; Kimihiko Nagami, Osaka, all of Japan

[73] Assignee: Sanyo Electric Co., Ltd., Osaka, Japan

[21] Appl. No.: 461,356

[22] Filed: Jan. 5, 1990

[30] Foreign Application Priority Data

Feb. 16, 1989 [JP] Japan ............................... 1-37494
Sep. 20, 1989 [JP] Japan ............................... 1-245747

[51] Int. Cl.$^5$ ............................................. H01L 21/66
[52] U.S. Cl. ............................................. 437/8; 437/7; 437/47; 437/60; 437/51; 437/935; 364/490; 364/491
[58] Field of Search ............ 437/7, 8, 47, 60, 51, 437/DIG. 35; 364/490, 491

[56] References Cited

U.S. PATENT DOCUMENTS

| | | | |
|---|---|---|---|
| 4,878,177 | 10/1989 | Ikenaga et al. | 364/490 |
| 4,933,860 | 6/1990 | Liu | 364/490 |
| 4,939,681 | 7/1990 | Yokomizo | 364/490 |
| 4,950,910 | 8/1990 | Yasuda et al. | 364/490 |

OTHER PUBLICATIONS

Ka-Band Monolithic GaA5 Power Fet Amplifiers, IEEE MTT-S Digest (Hung).
A Uni-Planar MMIC 26-GHz-Band Receiver, Tetsuo Hirota et al., GsAs IC Symposium 185 (Hirota).
A Monolithic 3 to 40 GHz HEMT Distributed Amplifier, C. Yuen et al., GsAs IC Symposium 105.
Monolithic Integrated Circuit Applications of InGaAs-/InAlAs HEMT's, M. Tutt et al., GaAs IC Symposium 293.
State of the Art of MMIC Technology and Design in West Germany, E. Pettenpaul, 1987, IEEE MTT-S Digest.

Primary Examiner—Brian E. Hearn
Assistant Examiner—Gordon V. Hugo
Attorney, Agent, or Firm—Darby & Darby

[57] ABSTRACT

An active device such as an HEMT is formed on a GaAs substrate, and characteristics of this active device formed are measured. A circuit pattern of a passive circuit device including a serial microstrip line is simulated on the basis of the results of this measurement, and a circuit pattern obtained by the simulation is directly drawn on a substrate to form the passive circuit device, thereby to fabricate an MMIC. Accordingly, the passive circuit device is formed in conformity with the characteristics of the active device for each chip.

As a result, the variation in characteristics of the active device is canceled, to obtain an MMIC superior in matching.

20 Claims, 14 Drawing Sheets (INPUT MATCHING CIRCUIT)   (OUTPUT MATCHING CIRCUIT)

Fig. 11A 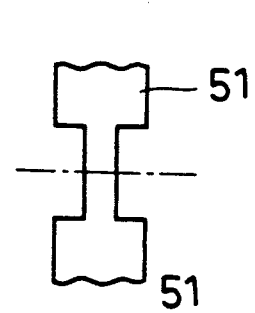 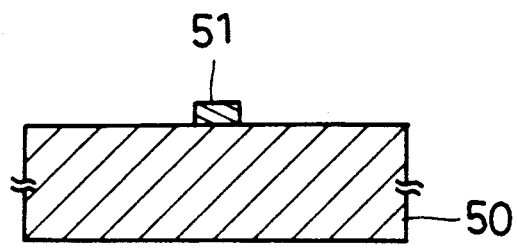
Fig. 11B 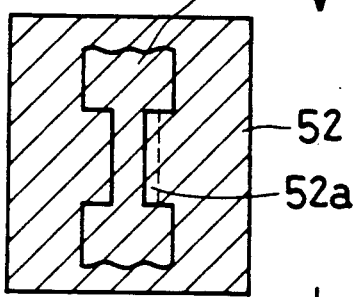 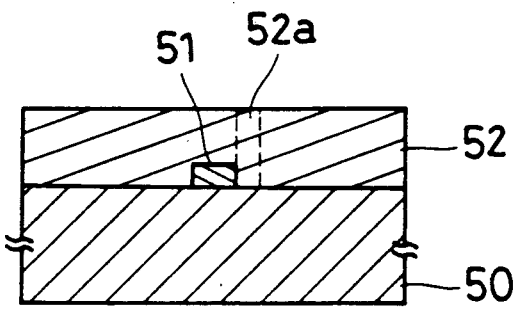
Fig. 11C 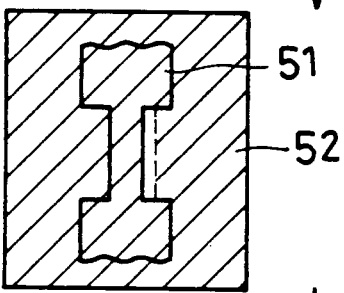 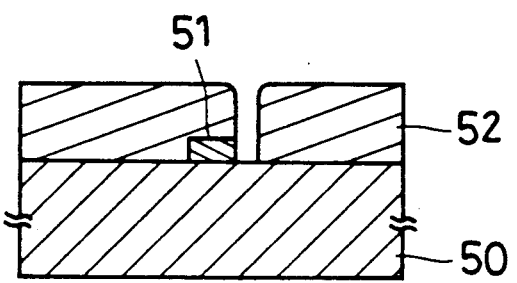
Fig. 11D 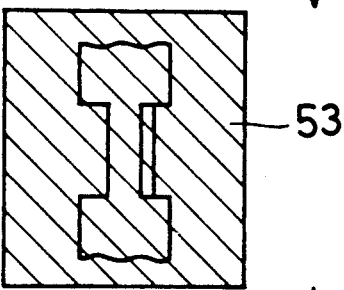 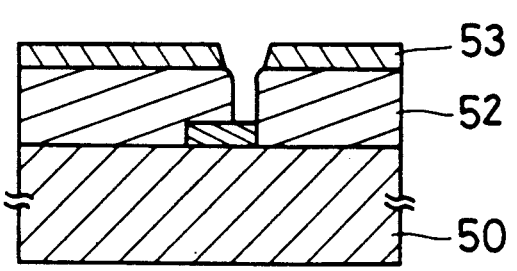
Fig. 11E 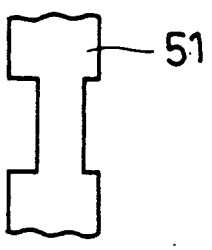 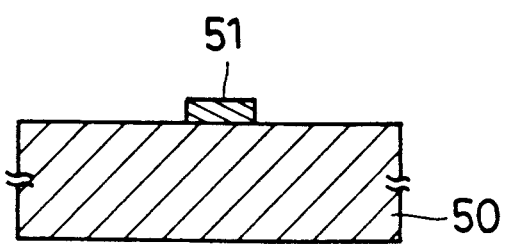

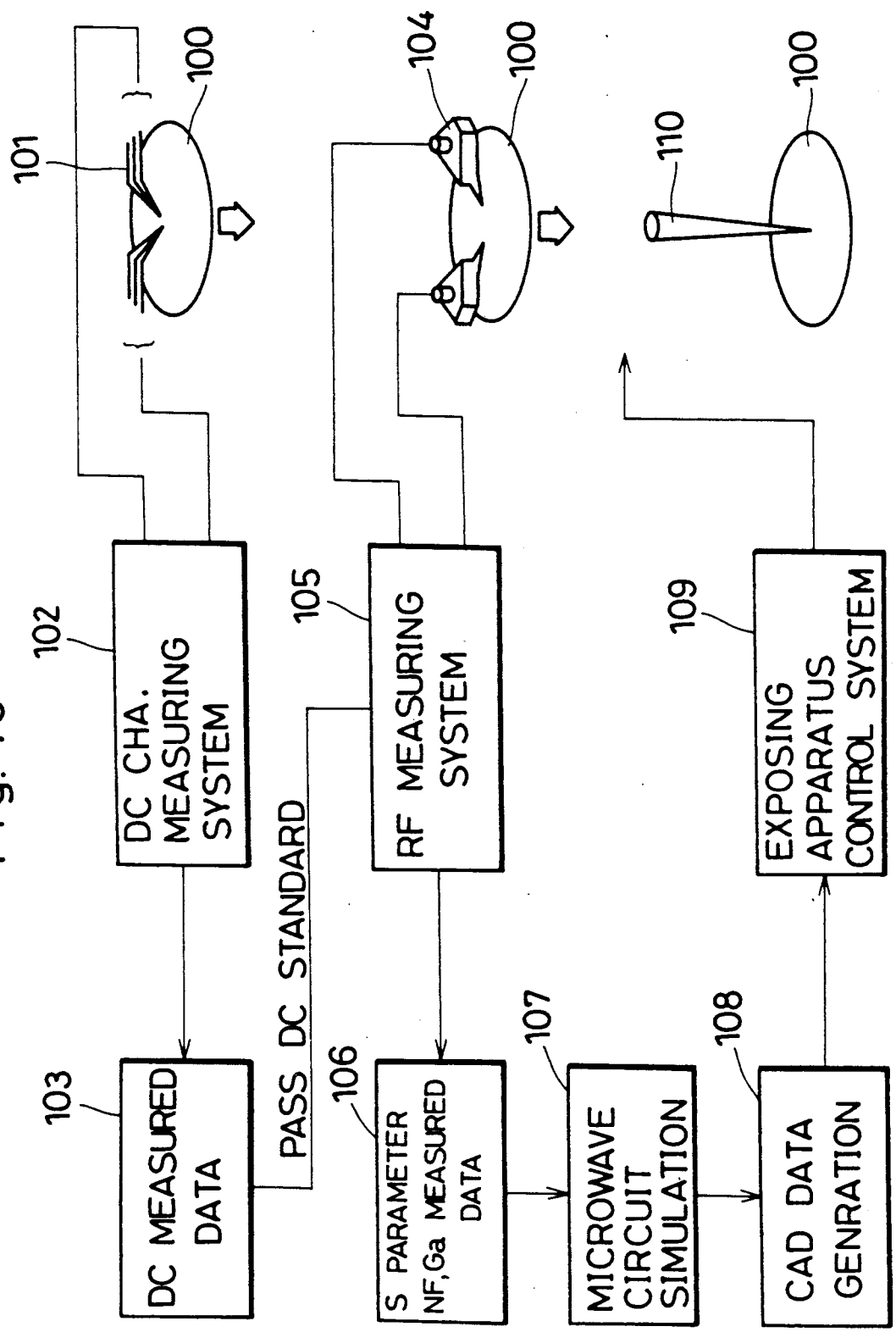

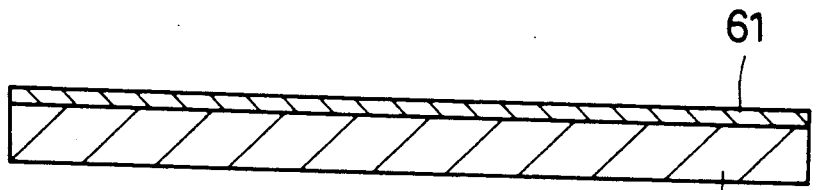
Fig. 16A
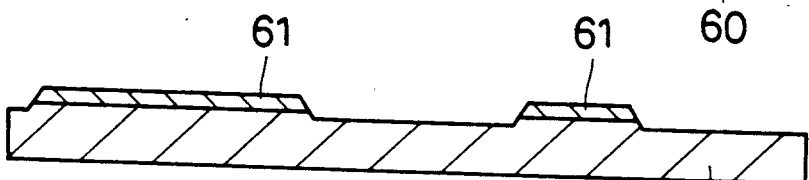
Fig. 16B
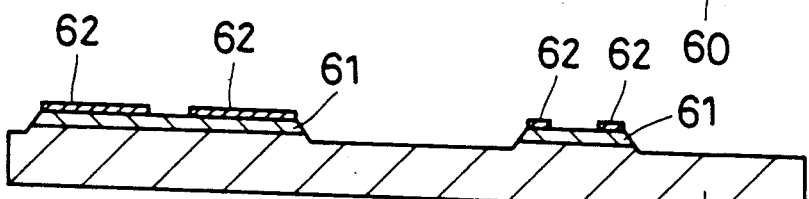
Fig. 16C
Fig. 16D
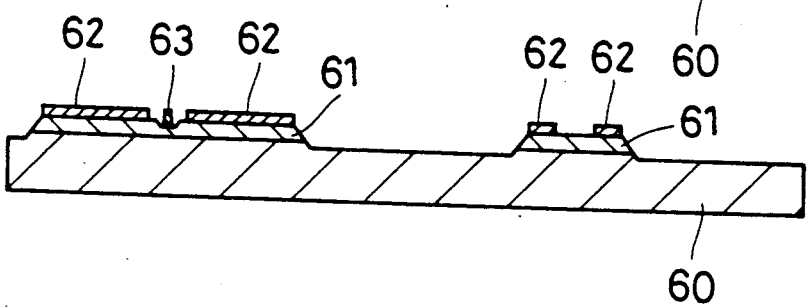
Fig. 16E
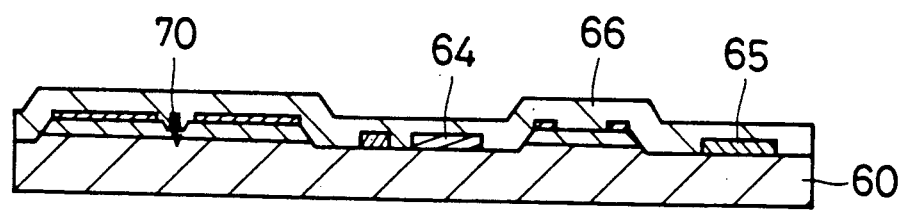
Fig. 16F
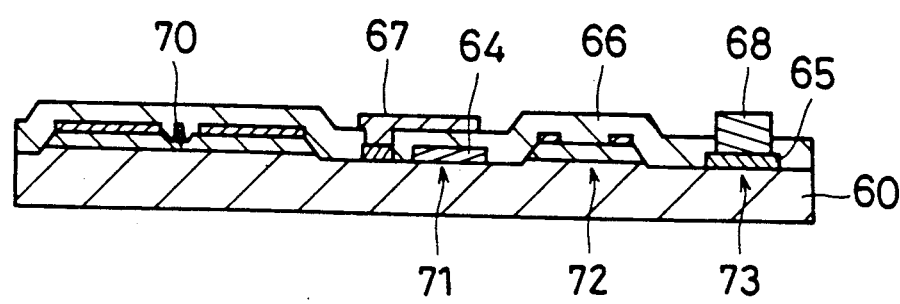

METHOD OF FABRICATING MMIC SEMICONDUCTOR INTEGRATED CIRCUITS USING THE RF AND DC MEASUREMENTS OF AN ACTIVE DEVICE ON A SUBSTRATE TO DESIGN THE PASSIVE ELEMENTS, WHICH ARE THEN E-BEAM WRITTEN TO THE SUBSTRATE

BACKGROUND OF THE INVENTION

1. Field of the Invention

The present invention relates to a method of fabricating semiconductor integrated circuits, and more particularly, to a method of fabricating MMICs (Monolithic Microwave Integrated Circuits) which can be made compact.

2. Description of the Prior Art

In microwave integrated circuits, hybrid integrated circuit techniques for mounting an active device and a passive circuit device on a dielectric substrate have been heretofore used. In recent years, however, MMICs suitable for compactness and quantity production have been put into practice. MMICs using an HEMT (High-Electron-Mobility Transistor), a GaAs MES FET (GaAs Metal-Semiconductor Field Effect Transistor), an HBT (Hetero-Bipolar Transistor) or the like are more favorable for compactness and light weight, as compared with hybrid ICs such as MICs (Microwave Integrated Circuits). In addition, the MMICs are superior in quantity production and reliability. Consequently, the MMICs are expected as key devices of various microwave equipments.

Circuit elements of an MMIC include an active device such as an HEMT, a GaAs MES FET or an HBT and a passive circuit device such as a transmission line (a microstrip line, a coplanar line or the like), a capacitor, an inductor or a coupler. As a method of forming the devices, microwave design techniques are required so as to improve matching of both the devices.

As a method of microwave matching, the passive circuit device is generally matched in characteristics with the active device by simulation using a concentrated constant or distributed constant circuit. A circuit pattern of a passitve circuit device has been conventionally determined as the first meaning by simulation based on the average value of DC and/or RF characteristics of several active devices formed on the substrate or by simulation based on a target value of the DC and/or RF characteristics. A photomask or the like is previously made on the basis of this circuit pattern determined. In actually fabricating an integrated circuit, an active device is first formed on a substrate and then, a passive circuit device is formed using this photomask. In general, if active devices are respectively formed on substrates under the same forming conditions, characteristics of the active devices differ depending on the substrates due to the variation in forming process. On the other hand, even if active devices are formed in the same substrate, characteristics of the active devices differ depending on the positions where they are formed. Consequently, in the conventional method of matching using a uniform photomask pattern, the active device and the passive circuit device may not be matched with each other. In such a case, mismatching of both the devices does not become clear until the time point when the MMIC is actually fabricated, resulting in a problem of low fabrication yield.

Additionally, days are required to make the photomask, thereby encountering a problem of requiring too much time until a single circuit characteristic can be measured.

SUMMARY OF THE INVENTION

Briefly stated, according to the present invention, an active device is formed on a substrate. Characteristics of the active device formed are measured, to simulate a circuit pattern of a passive circuit device on the basis of the results of this measurement. The circuit pattern obtained by the simulation is directly drawn.

In accordance with another aspect of the present invention, characteristics of an active device formed on a substrate are measured, to select the most suitable circuit pattern out of a plurality of circuit patterns of a passive circuit device previously designed on the basis of the results of this measurement and directly draw the same.

In accordance with still another aspect of the present invention, an active device and a passive circuit device are formed on a substrate. Characteristics of the active device formed are measured, to simulate a circuit pattern of the passive circuit device on the basis of the results of this measurement. A circuit pattern obtained by the simulation is compared with the circuit pattern of the passive circuit device which has been already formed on the above substrate, to determine a portion to be changed. The circuit pattern obtained by the above simulation is directly drawn with respect to this portion to be changed.

In accordance with yet still another aspect of the present invention, an active device and a passive circuit device are formed on a substrate. Matching of both the devices formed is evaluated. If the matching is poor, characteristics of the active device formed are measured, to simulate a circuit pattern of the passive circuit device on the basis of the results of this measurement. A circuit pattern obtained by the simulation is compared with the circuit pattern of the passive circuit device which has been already formed on the above substrate, to determine a portion to be changed. The circuit pattern obtained by the above simulation is directly drawn with respect to this portion to be changed.

In accordance with a further aspect of the present invention, a plurality of devices are formed on a substrate, and DC characteristics of each of the active devices formed are measured by first measuring means. From the results of this measurement, characteristics such as S parameters of all active devices conforming to the DC characteristic standard are measured by second measuring means. On the basis of the results of this measurement, circuit patterns of passive circuit devices are simulated by a simulation system, to determine desired circuit patterns for the active devices, respectively. The circuit patterns determined are directly drawn on a resist applied on the substrate, to respectively form the passive circuit devices.

In accordance with a still further aspect of the present invention, the thickness of a substrate is made a basis in determining circuit patterns of passive circuit devices.

Accordingly, a primary object of the present invention is to make reliable matching of an active device and a passive circuit device formed in conformity with characteristics of the active device for one chip, thereby to provide a method of fabricating a semiconductor integrated circuit in which fabrication yield can be significantly improved.

A principal advantage of the present invention is that characteristics of an active device formed are measured and a circuit pattern of a passive circuit device is drawn on the basis of the results of the measurement, thereby allowing the passive circuit device to be formed in conformity with the characteristics of the active device for one chip and consequently, a semiconductor circuit (MMIC) superior in matching of both the devices can be fabricated by canceling the variation in characteristics of the active device, resulting in significantly improved fabrication yield.

Another advantage of the present invention is that the most suitable circuit pattern of a passive circuit device previously formed is selected out of a plurality of circuit patterns thereof on the basis of the results of measurement of characteristics of an active device formed, thereby allowing a semiconductor circuit superior in matching of both the devices to be fabricated in a short time without requiring simulation.

Still another advantage of the present invention is that an active device and a passive circuit device are first formed and a circuit pattern is changed only with respect to an unsuitable portion, thereby allowing active devices and passive circuit devices to be formed in a series of steps with respect to a lot of circuits.

A further advantage of the present invention is that passive circuit devices respectively suitable for a plurality of active devices formed on a substrate, to form an integrated circuit superior in matching on the substrate, and circuit patterns of the passive circuit devices are not formed for active devices which do not conform to the DC characteristic standard, thereby allowing only an integrated circuit using active devices of good quality to be accurately and quickly provided.

A still further advantage of the present invention is that not only characteristics of an active device but also the thickness of a substrate is added as data in determining a circuit pattern of a passive circuit device, thereby allowing fabrication yield to be further improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11 and 12 are diagrams typically showing the steps of a fabricating method according to the present invention;

FIG. 15 is a block diagram for explaining a fabricating method according to the present invention; and FIG. 16 is a cross-sectional view showing the steps of the fabricating method according to the present invention.

DESCRIPTION OF THE PREFERRED EMBODIMENTS

A first embodiment of the present invention will be described by taking as an example an HEMT MMIC amplifier using an HEMT as an active device.

Figure 1:
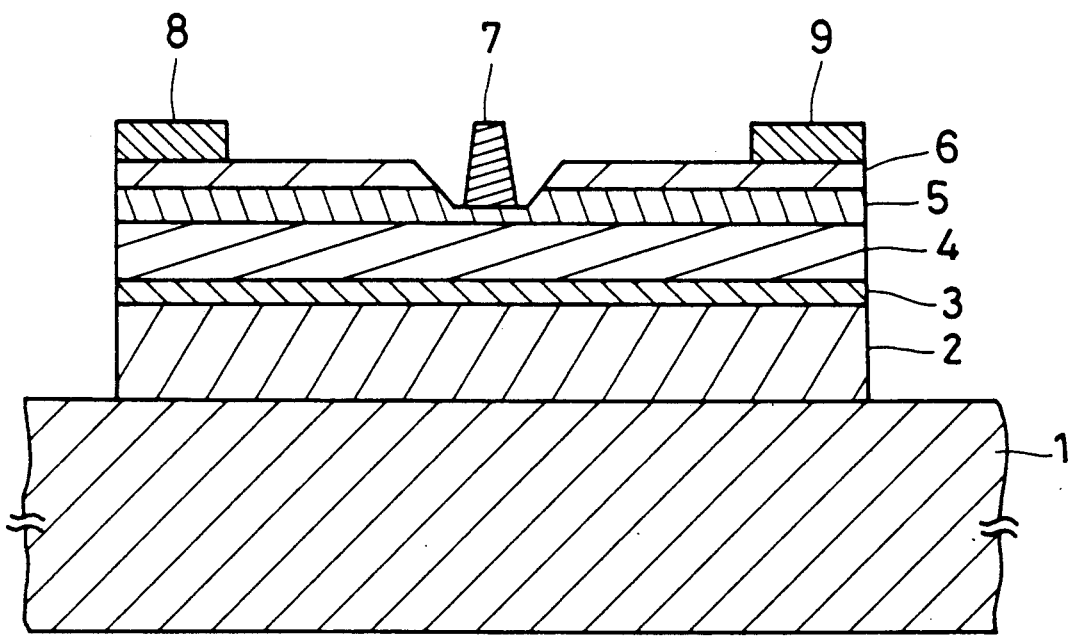
FIG. 1 is a cross-sectional view illustrating an active device of an HEMT MMIC amplifier fabricated according to the present invention.

FIG. 1 is a cross-sectional view showing a structure of an HEMT formed on a semi-insulated GaAs substrate 1.

In FIG. 1, a non-doped GaAs layer 2, a non-doped AlGaAs layer 3, an $n^+$ AlGaAs layer 4, an n GaAs layer 5, and an $n^+$ GaAs layer 6 are laminated and formed in this order on the GaAs substrate 1. A gate electrode 7 is formed on the n GaAs layer 5, which along with the $n^+$ GaAs layer 6, is partially etched away, and a source electrode 8 and a gate electrode 9 are formed on the $n^+$ GaAs layer 6. The HEMT has the above described structure.

Description is now made of the steps of a method of fabricating this HEMT MMIC amplifier.

As shown in FIG. 1, an HEMT is first formed on a GaAs substrate 1. DC characteristics and high-frequency characteristics of this HEMT formed are measured by a wafer prober. The size of an electrode pattern of a passive circuit device is calculated by simulation on the basis of the results of the characteristics measured. The results of this calculation are then inputted to CAD (Computer Aided Design) data in an electron beam exposing apparatus or a focused ion beam exposing apparatus. This pattern is drawn using the exposing apparatuses to directly expose a resist applied on the substrate 1 by irradiation of an electron beam or a focused ion beam, to form the passive circuit device on the substrate 1.

In this case, the speed of fabricating operations can be increased if the circuit pattern of the passive circuit device is not drawn with respect to a chip in which characteristics measured of an active device do not meet the standard.

Figure 2A:
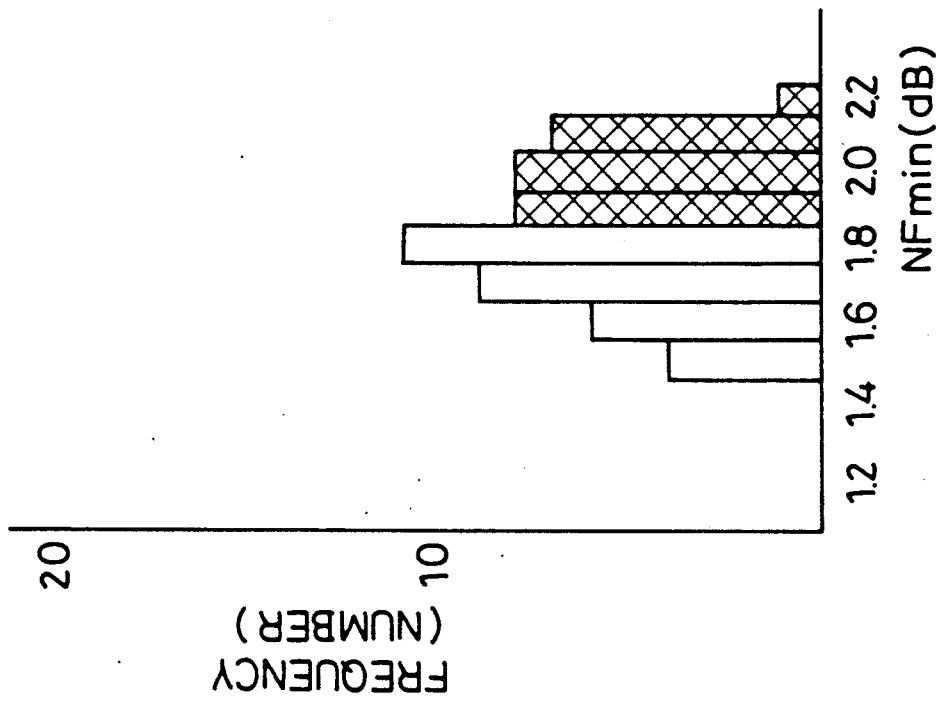
FIG. 2A is a histogram showing characteristics of the HEMT MMIC amplifier fabricated according to the present invention.
Figure 2B:
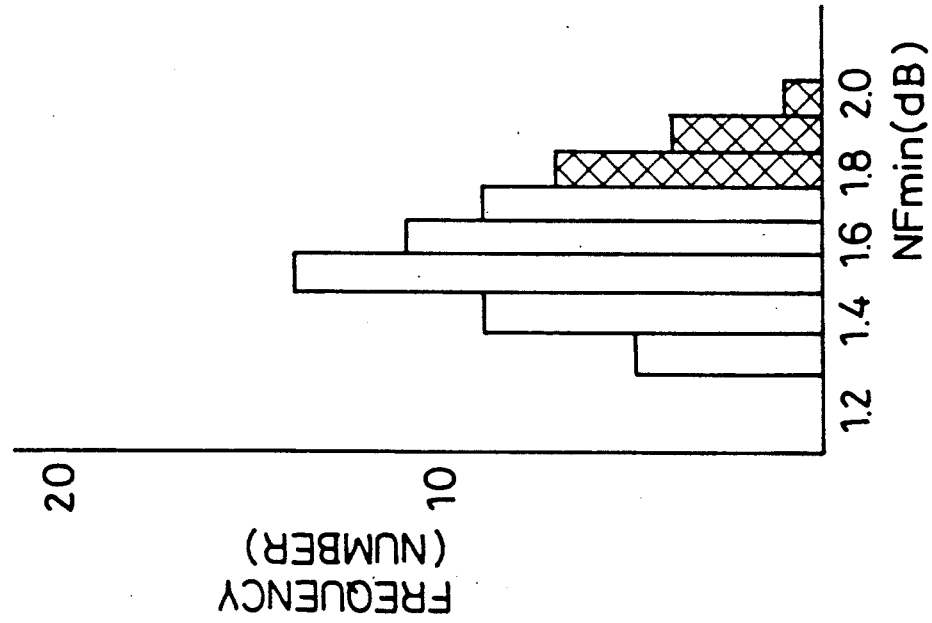
FIG. 2B is a histogram showing characteristics of an HEMT MMIC amplifier fabricated in the conventional method.

FIG. 2A is a graph showing a frequency distribution of characteristics of the HEMT MMIC amplifier thus fabricated. As a comparative example, FIG. 2B is a graph showing a frequency distribution of characteristics of a similar HEMT MMIC amplifier fabricated in the conventional fabricating method. In both graphs, a minimum noise figure NFmin (dB) in 12 GHz is used to enter the axis of abscissa, and the frequency (the number) is used to enter the axis of ordinate. When NFmin≦1.7 dB is set as a target value in 12 GHz, hatched portions in FIG. 2 correspond to defective products. In the embodiment of the present invention, the percentage of defective products is decreased to approximately 20 percent, as compared with the conventional example in which the percentage of defective products is 40 percent or more. Consequently, it is understood that fabrication yield can be improved.

Description is now made a second embodiment of the present invention in which a low noise MMIC amplifier of a 12 GHz band using an FET as an active device can be fabricated. In this embodiment, consider a single-end amplifier having a circuit as shown in FIG. 3 by way of example.

Figure 3:
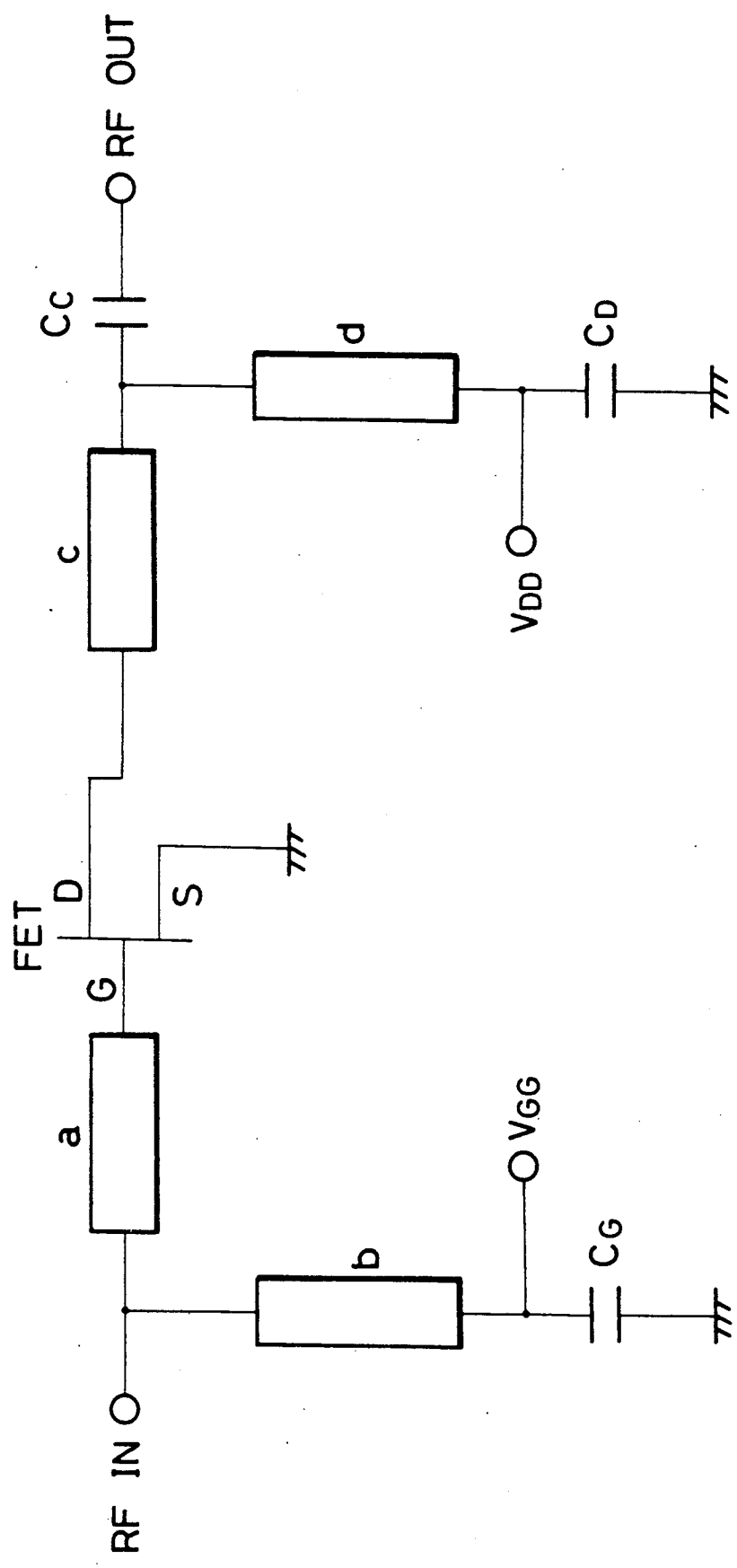
FIG. 3 is a diagram showing an equivalent circuit of an FET MMIC fabricated according to the present invention.
Figure 4A:
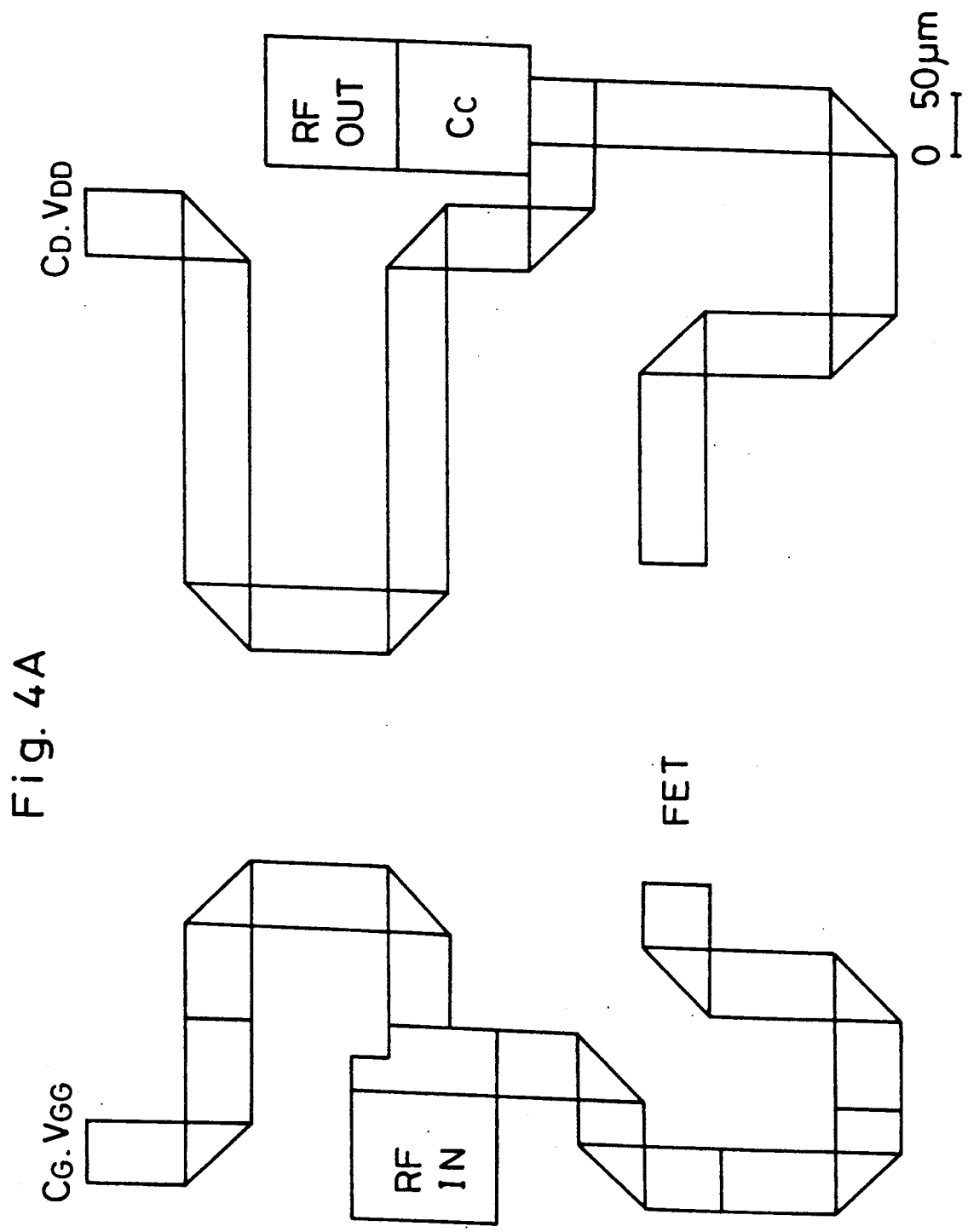
FIGS. 4A, 4B and 4C are diagrams showing a pattern of a transmission line designed on the basis of characteristics of an FET shown in FIG. 3.

An FET shown in FIG. 3 is first formed on a substrate, to measure DC characteristics and high-frequency characteristics of the FET formed by a wafer prober. The shapes of passive circuit devices, that is, serial microstrip lines (a and c in FIG. 3), parallel microstrip lines (b and d in FIG. 3), shunt capacitors ($C_G$ and $C_D$ in FIG. 3), and DC cut capacitor ($C_C$ in FIG. 3) are derived by simulation on the basis of the results of the characteristics measured. FIG. 4A is a diagram illustrating a circuit pattern derived by simulation. In FIG. 3, G, S and D respectively denote a gate electrode, a source electrode and a drain electrode, and $V_{GG}$ and $V_{DD}$ respectively indicate a gate bias and a drain bias. The source electrode S of the FET is grounded by a via hole.

Data having the most suitable circuit pattern as shown in FIG. 4A is inputted as CAD data to an electron beam exposing apparatus or a focused ion beam exposing apparatus. This circuit pattern is drawn using the exposing apparatuses to directly expose a resist applied on a substrate by irradiation of an electron beam or a focused ion beam on the basis of this data, thereby to form the above described passive circuit devices. In this case, the length and the width of the microstrip line are respectively set to the most suitable values depending on the measured high-frequency characteristics of the FET.

Meanwhile, the shunt capacitors $C_G$ and $C_D$ and the DC cut capacitor $C_C$ may be an MIM capacitor or can use a depletion layer formed by the pn junction and the Schottky contact. In addition, when the capacitance within the substrate is changed, the shunt capacitors $C_G$ and $C_D$ and the DC cut capacitor $C_C$ may be also formed at the same time when the active device (FET) is formed and capacitances of the shunt capacitors $C_G$ and $C_D$ and the DC cut capacitor $C_C$ may be also measured at the same time when the characteristics of the active device (FET) are measured, to derive the shapes of the serial microstrip lines a and c and the parallel microstrip lines b and d by simulation so as to be matched with the shunt capacitors and the DC cut capacitor.

Simulation of a circuit pattern according to the present invention will be described in more detail.

S parameters of an MESFET 1 and an MESFET 2 respectively formed on substrates are measured by an RF prober. As the results of the measurement, data shown in Tables 1 and 2 are obtained. Circuit patterns obtained by simulation on the basis of the data are respectively illustrated in FIGS. 4B and 4C.

This integrated circuit pattern is of an MMIC single-stage amplifier, in which matching circuits are provided in an input and an output of the MESFET.

As shown in Tables 1 and 2, the S parameters of the MESFET 1 and MESFET 2 are the same except that the phases in S11 are different from each other.

Figure 4B:
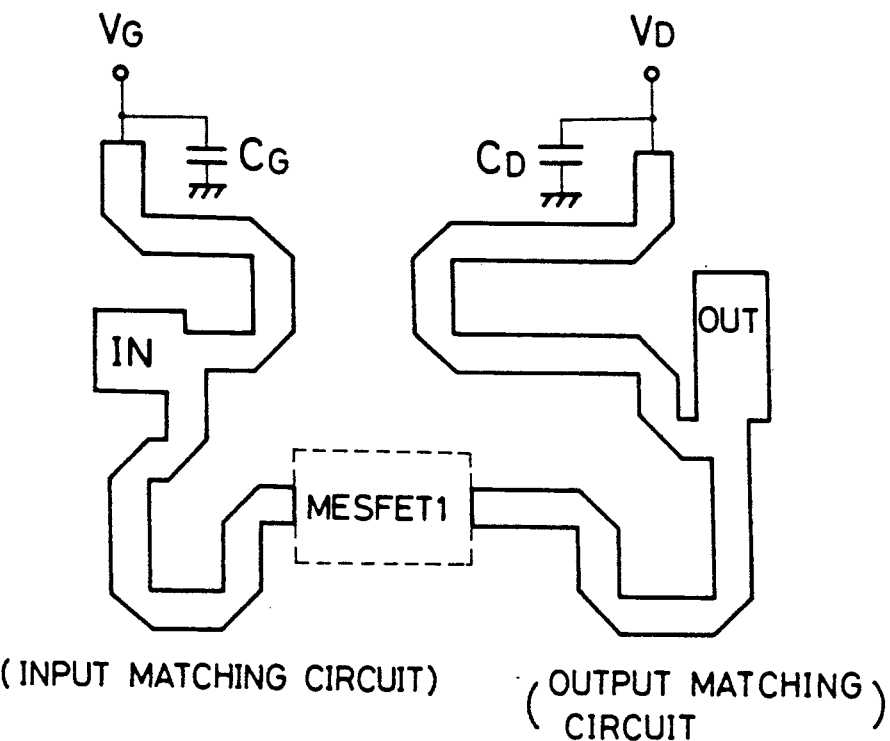
Figure 4C:
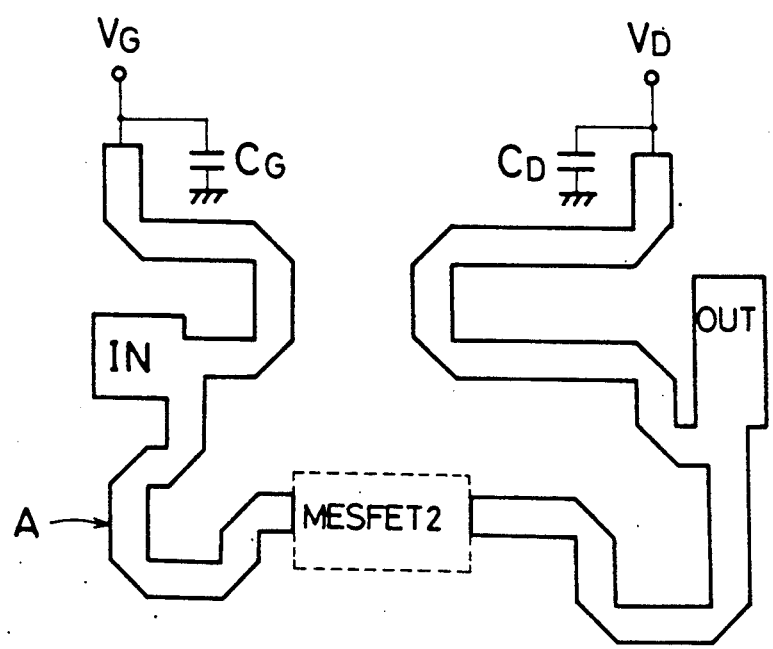

In FIG. 4C, simulation is achieved such that the amplifier using the MESFET 2 has the same characteristics as those of the amplifier using the MESFET 1 shown in FIG. 4B. In an input matching circuit shown in FIG. 4C, the distance (an arrow A in FIG. 4C) from the input to the FET is decreased by approximately 0.1 mm, as compared with that in an input matching circuit shown in FIG. 4B. On the other hand, output matching circuits shown in FIGS. 4B and 4C have all the same pattern.

TABLE 1

| FREQ. (GHz) | S parameter of MESFET 1 | | | | | | | |
|---|---|---|---|---|---|---|---|---|
| | S11 | | S21 | | S12 | | S22 | |
| | MAG. | PHASE | MAG. | PHASE | MAG. | PHASE | MAG. | PHASE |
| 10 | 0.80 | −88° | 1.82 | 106° | 0.15 | 37° | 0.59 | −44° |
| 11 | 0.77 | −93° | 1.72 | 101° | 0.15 | 34° | 0.57 | −46° |
| 12 | 0.76 | −97° | 1.62 | 95° | 0.16 | 30° | 0.56 | −49° |
| 13 | 0.74 | −101° | 1.53 | 92° | 0.16 | 27° | 0.55 | −51° |
| 14 | 0.73 | −104° | 1.46 | 88° | 0.16 | 23° | 0.53 | −52° |
| 15 | 0.72 | −107° | 1.40 | 84° | 0.16 | 23° | 0.53 | −54° |

TABLE 2

| FREQ. (GHz) | S parameter of MESFET 2 | | | | | | | |
|---|---|---|---|---|---|---|---|---|
| | S11 | | S21 | | S12 | | S22 | |
| | MAG. | PHASE | MAG. | PHASE | MAG. | PHASE | MAG. | PHASE |
| 10 | 0.80 | −98° | 1.82 | 106° | 0.15 | 37° | 0.59 | −44° |
| 11 | 0.77 | −103° | 1.72 | 101° | 0.15 | 34° | 0.57 | −46° |
| 12 | 0.76 | −107° | 1.62 | 95° | 0.16 | 30° | 0.56 | −49° |
| 13 | 0.74 | −111° | 1.53 | 92° | 0.16 | 27° | 0.55 | −51° |
| 14 | 0.73 | −114° | 1.46 | 88° | 0.16 | 23° | 0.53 | −52° |
| 15 | 0.72 | −117° | 1.40 | 84° | 0.16 | 23° | 0.53 | −54° |

Figure 5A:
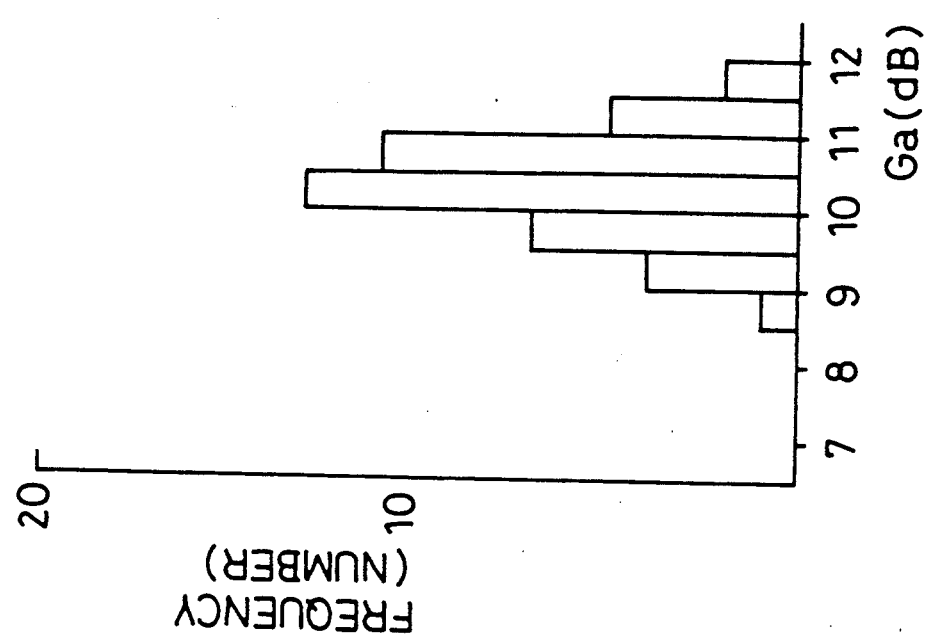
FIGS. 5A and 5B are histograms showing characteristics of the FET MMIC fabricated according to the present invention.
Figure 5B:
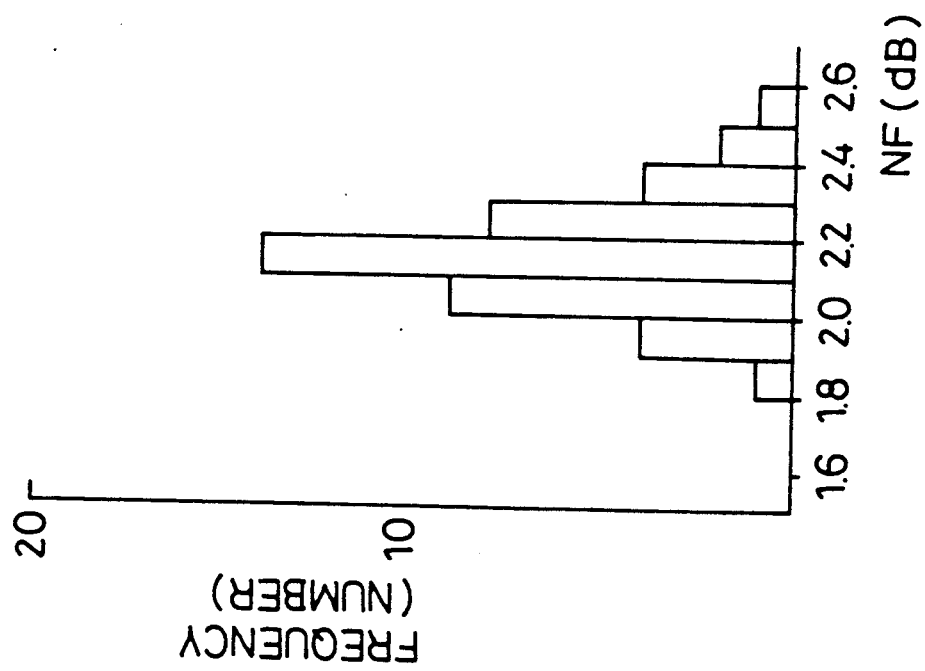
Figure 6A:
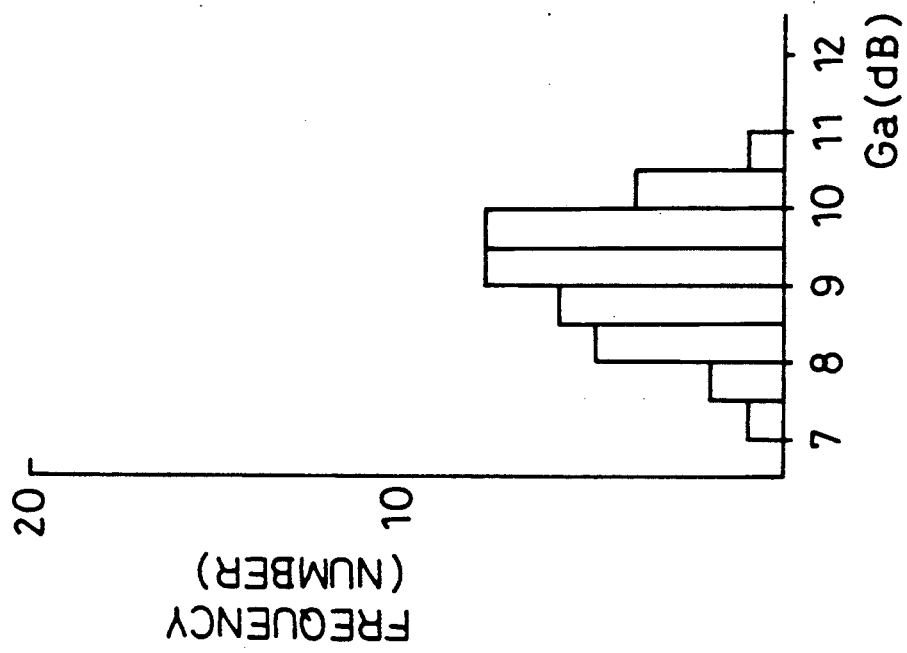
FIGS. 6A and 6B are histograms showing characteristics of an FET MMIC fabricated in the conventional method.
Figure 6B:
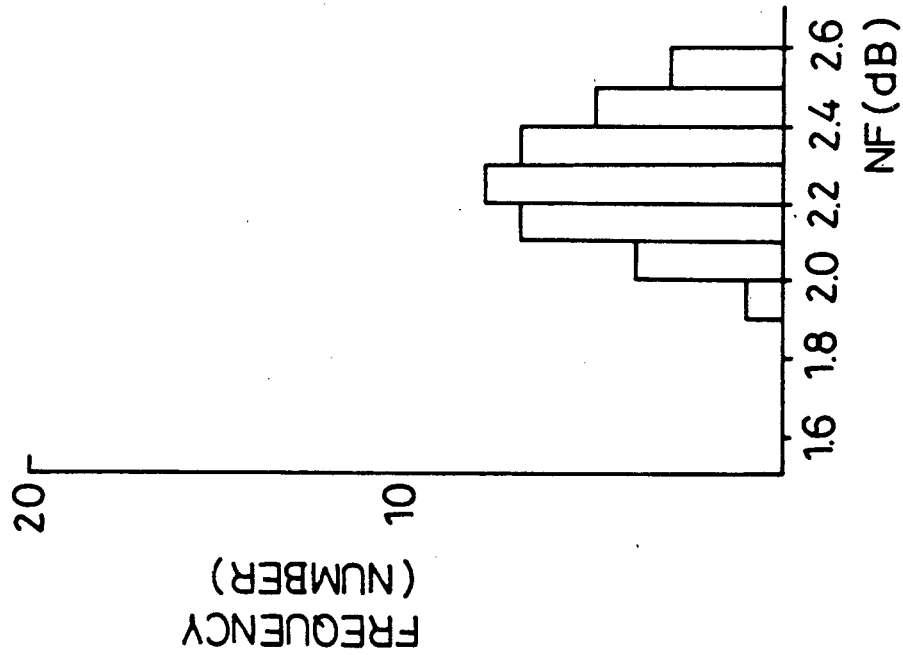

FIGS. 5A amd 5B are graphs each showing a frequency distribution of a noise figure NF and gain Ga in 12 GHz of the single-end amplifier shown in FIG. 3 thus fabricated. As a comparative example, prepared is a similar single-end amplifier fabricated in the conventional fabricating method in which a passive circuit device is formed according to a fixed and uniform circuit pattern. FIGS. 6A and 6B are graphs each showing a frequency distribution of a noise figure NF and gain Ga in 12 GHz of this single-end amplifier prepared as a comparative example. By comparing FIGS. 5 and 6, it is understood that the average value of characteristics is improved, the dispersion is smaller, and the fabricating precision is increased in the amplifier fabricated according to the present invention, as compared with the amplifier fabricated in the conventional method. This is caused by the fact that a passive circuit device such as a proper microstrip line is formed in conformity with the results of measurement of characteristics of an FET (active device) formed on each substrate, in the present invention.

Description is now made of a third embodiment in which a uniplanar MMIC is fabricated.

The uniplanar MMIC has a coplanar line serving as a basic transmission line. Matching of this coplanar line serving as the passive circuit device and an FET serving as an active device is a problem. The coplanar line comprises a central conductor and a ground conductor around its periphery. Characteristics of the coplanar line can be changed depending on the width and length of the central conductor and the distance between the central conductor and the ground conductor.

As a microwave transistor, an HEMT having a gate length of 0.5 μm and a gate width of 200 μm is formed on a GaAs substrate. The noise figure NF and the gain Ga in 12 GHz of the HEMT at this time are respectively 1.0 dB and 10 dB.

Then, the ground conductor in the coplanar line is formed depending on the length or the shape of the coplanar line previously found by rough calculation.

Characteristics such as an S parameter, a constant noise circle and a constant gain circle of the HEMT formed are then measured by a microwave prober or a network analyzer. On this occasion, it is desirable to also form a ground conductor around the HEMT because the measuring precision is increased.

The impedance of a matching circuit corresponding to the results of the characteristics measured is then calculated by simulation. The central conductor in the coplanar line is formed in conformity with this calculated pattern using a direct drawing method such as electron-beam exposure. At this time, consideration is give to the width and the length of the coplaner line and the distance from the ground conductor to the coplaner line. In the above described manner, a uniplanar MMIC superior in matching is fabricated.

Description is now made of an embodiment to which the method according to the present invention is applied in forming a capacitor having an overlay structure (MIM) as the passive circuit device. A small capacity capacitor, which has an interdigital structure, can be formed in a single direct drawing based on the above described characteristics of the active device. On the other hand, a large capacity capacitor, which has an overlay structure, cannot be formed by a single direct drawing. Accordingly, direct drawing is repeated, thereby to form such a capacitor.

Figure 7A:
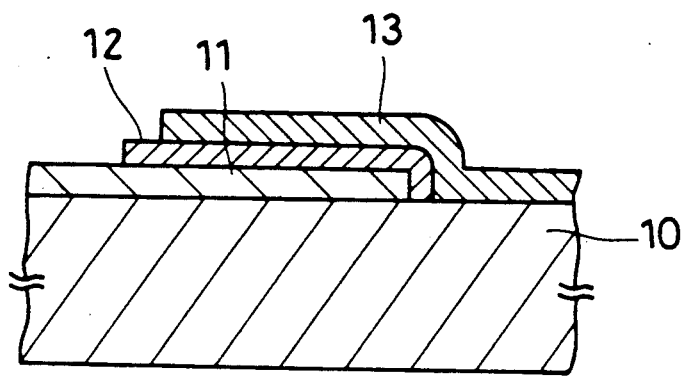
FIGS. 7A and 7B are respectively a cross-sectional view and a top view showing an overlay structure of a capacitor fabricated according to the present invention.
Figure 7B:
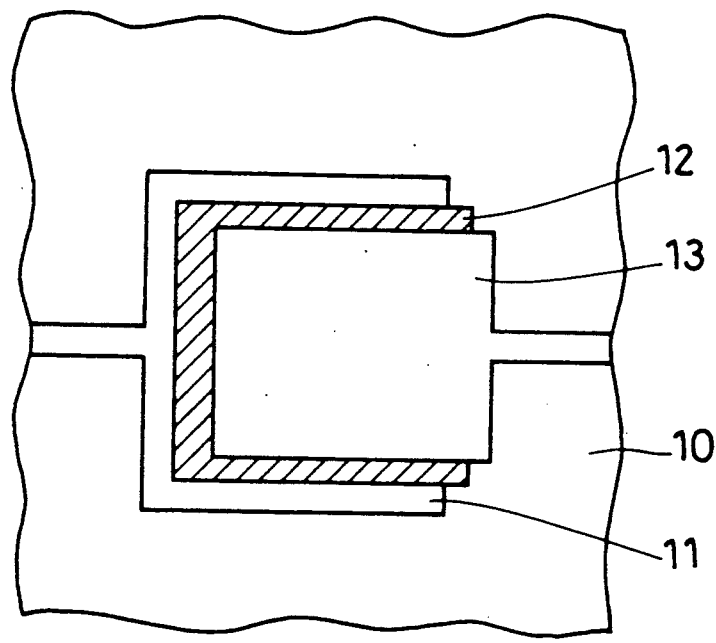

The process of forming the capacitor having such an overlay structure will be described with reference to FIGS. 7A and 7B respectively showing the cross section of the overlay structure (FIG. 7A) and the upper surface thereof (FIG. 7B).

First, an active device such as an HEMT or an MESFET is formed, to measure characteristics (DC characteristics and high-frequency characteristics) of each active device. A series of patterns to be directly drawn as described below are controlled depending on the results of this measurement. A lower metal layer 11 is formed on a semi-insulated GaAs substrate 10 using a method of direct drawing to a resist at the same time when another line or a resistance is formed. The resist is then covered and then, a pattern of a dielectric is directly drawn on this resist, to form a dielectric thin film 12 composed of SiO$_2$, SiN or the like using this pattern. Finally, an upper metal layer 13 is formed on the dielectric thin film 12 using the same direct drawing method as that used when the lower metal layer 11 is formed.

As described in the foregoing, a capacitor having an overlay structure superior in matching with the active device can be formed.

Figure 8:
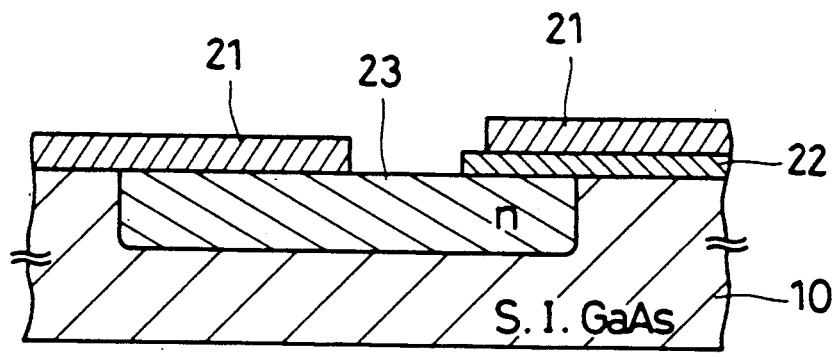
FIG. 8 is a cross-sectional view illustrating a capacitor using a Schottky barrier diode.
Figure 9:
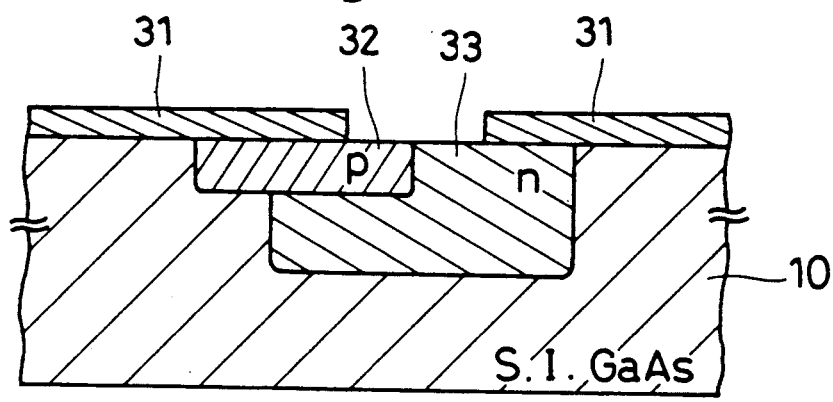
FIG. 9 is a cross-sectional view illustrating a capacitor using a pn junction diode.
Figure 10:
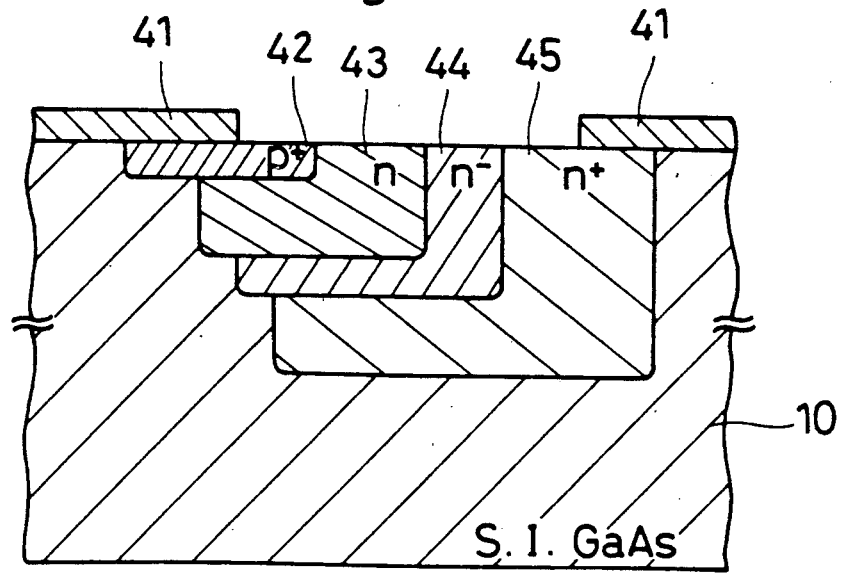
FIG. 10 is a cross-sectional view showing a structure of a capacitor using a varactor diode.

Meanwhile, a capacitor using a diode has been known in addition to the above described capacitor having an overlay structure. FIG. 8 is a cross-sectional view illustrating a capacitor using a Schottky barrier diode. In FIG. 8, the capacitor comprises a semi-insulated GaAs substrate 10, a metal 21, and ohmic electrode 22, and an n layer 23. The n layer 23 is previously formed by ion implantation to the GaAs substrate 10 in forming an active device. After forming the active device, a capacitor having such capacitance that matches this active device is formed. The capacitance C of the capacitor is determined as represented by the following equation (1). Consequently, the capacitance C of the capacitor formed can be matched with the active device by controlling a junction area (diode area) S of the metal 21 and the n layer 23.

$$C = S\sqrt{e \cdot \epsilon s \cdot \epsilon_0 \cdot n_0/2 \, (V + V_{B1})} \quad (1)$$

e: charge on an electron
εs: relative dielectric constant of a semiconductor
ε$_0$: dielectric constant in a vacuum
n$_0$: impurity concentration
V$_{B1}$: built-in voltage
V: reverse bias Furthermore, an example of a capacitor using a pn junction diode is shown in FIG. 9, and an example of a capacitor using a varactor diode is shown in FIG. 10. In FIG. 9, the capacitor using the pn junction diode comprises a semi-insulated GaAs substrate 10, a metal 31, a p layer 32, and an n layer 32. In FIG. 10, the capacitor using the varactor diode comprises a semi-insulated GaAs substrate 10, a metal 41, a p+ layer 42, an n layer 43, and n− layer 44, and an n+ layer. In such examples, the capacitance of the capacitor is determined by the junction area of the diode. Accordingly, a plurality of capacitors are previously formed and a method of connecting the capacitors to a circuit (the number of the capacitors, parallel or serial connection, or the like), to achieve superior matching with the active device.

In the fabricating method as described in detail above, characteristics of each active device formed are measured. A circuit pattern of a passive circuit device is calculated by simulation on the basis of the results of this measurement. The passive circuit device is formed for each active device on the basis of the results of the calculation such that matching of both the devices becomes the most suitable. Consequently, matching of the active device with the passive circuit device is always good in each chip, so that fabrication yield is improved. In particular, when a trial product attempts to be manufactured, that is, when modules of many qualities are gradually produced on the same substrate, such a fabricating method is substantially effective.

In this fabricating method, however, the most suitable circuit pattern of the passive circuit device is calculated by simulation for each active device and then, the pattern of the passive circuit device is directly drawn on the resist for each passive device. Consequently, the fabricating method has the disadvantage in that a long time is required to fabricate a circuit. In order to overcome such a disadvantage, there are provided fabricating methods according to fourth, fifth and sixth embodiments of the present invention.

In the fabricating method according to the fourth embodiment, a plurality of circuit patterns of a passive circuit device calculated by simulation have been previously prepared. An active device is formed on a substrate. The most suitable circuit pattern is selected out of the circuit patterns prepared on the basis of the results of measurement of characteristics of the active device formed. This circuit pattern selected is directly drawn on a resist applied on the substrate, to form the passive circuit device. A direct drawing method in this case is the same as that in the above described first embodiment. This fourth embodiment can be applied to all the embodiments described as the first, second and third embodiments.

The fabricating method according to this fourth embodiment is somewhat inferior in terms of matching in each active device, as compared with the fabricating methods according to the first, second and third embodiments. However, simulation is not required after the active device is formed. Accordingly, this fabricating method has the advantage that a circuit superior in matching can be fabricated in a short time. In addition, as in the fabricating methods according to the first to third embodiments, time required for fabrication can be further shortened provided the passive circuit device is not formed for an active device whose characteristics are poor as a result of measurement. The degradation of matching can be decreased to a large extent if a lot of circuit patterns are prepared in conformity with a fine classification of characteristics.

In the fabricating method according to the fifth embodiment, an active device and a passive circuit device are first formed on a substrate. Thereafter, characteristics of the active device formed are measured. The most suitable circuit pattern of the passive circuit device is calculated by simulation on the basis of the results of this measurement. A pattern of the passive circuit device which has been already formed is compared with the results of this simulation, to directly draw a circuit pattern to be changed on a resist applied on the substrate only with respect to a portion where the change is required. Then, etching is made when patterns must be decreased, while evaporation is performed, followed by lift-off when patterns must be added.

Description is now made of a specific example of the fifth embodiment.

First, an example in which the size of an inductor which is a passive circuit device of an MMIC is increased will be described with reference to FIG. 11 showing the steps. In FIG. 11, the left diagrams are top views, and the right diagrams are cross-sectional views.

An active device and a passive circuit device of the MMIC are formed on a GaAs substrate 50 and then, characteristics of the active device are measured. The most suitable circuit pattern of the passive circuit device is calculated on the basis of the results of this measurement. By comparing this most suitable circuit pattern with a circuit pattern of the passive circuit device which has been formed, it becomes clear that the size of an inductor 51 must be increased so as to make matching of both the devices better (see FIG. 11A). A resist 52 such as PMMA (polymethyl methacrylate) is applied on the GaAs substrate 50 while rotating the same (see FIG. 11B). A resist 52a in a region corresponding to a portion where the size of the inductor is increased is exposed using electron beam drawing techniques and then, is developed (see FIG. 11C). A metal layer 53 composed of Ti/Pd/Au is then evaporated (see FIG. 11D). Finally, the metal layer 53, along with the resist 52, is removed using an organic solvent, to complete the increase in size of the inductor 51 (see FIG. 11E).

An example in which the size of the inductor is decreased will be described with reference to FIG. 12 showing the steps. In FIG. 12, the left diagrams are top views, and the right diagrams are cross-sectional views.

Figure 12A:
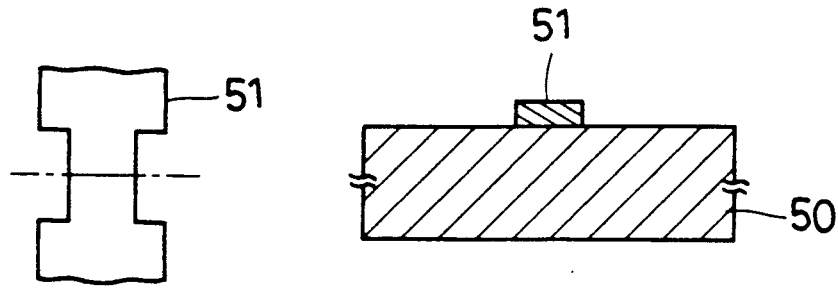
Figure 12B:
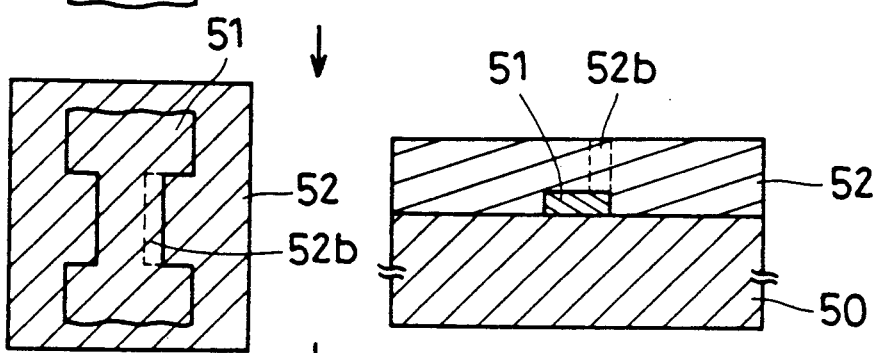
Figure 12C:
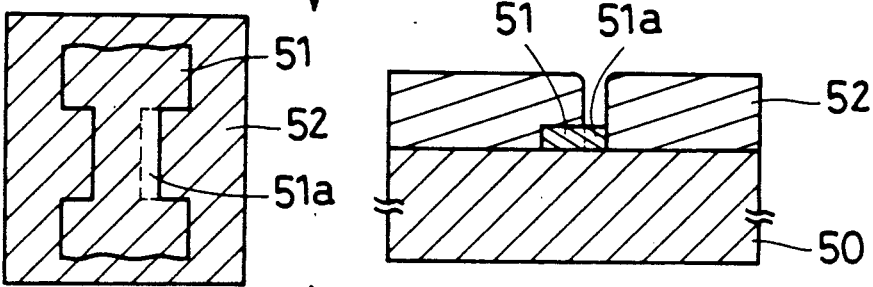
Figure 12D:
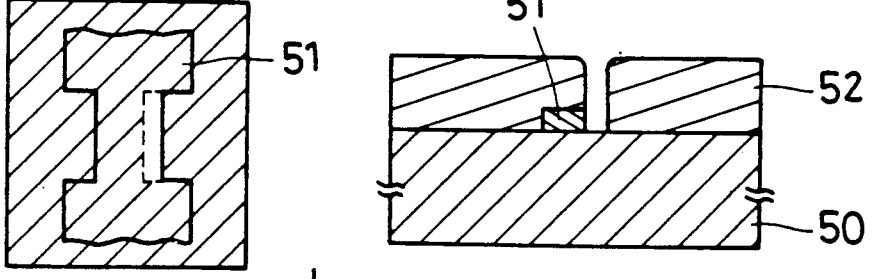
Figure 12E:
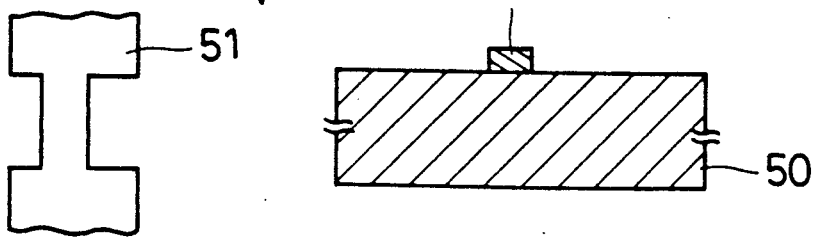

After an active device and a passive circuit device of an MMIC are formed on a GaAs substrate 50, it becomes clear by simulation based on the results of measurement of characteristics of the active device that the size of an inductor 51 must be decreased so as to make matching of both the devices better (see FIG. 12A). First, a resist 52 such as PMMA (polymethyl methacrylate) is applied on the GaAs substrate 50 while rotating the same (see FIG. 12B). A resist 52b in a region corresponding to a portion where the size of the inductor is decreased is exposed using electron beam drawing techniques and then, is developed (see FIG. 12C). An inductor 51a composed of Ti/Pd/Au in a region where the size of the inductor must be decreased is then etched away by an RIE (Reactive Ion Etching) process using gas containing $CF_4 + O_2$ ($O_2$: 4%). Finally, the remaining resist 52 is removed using an organic solvent, to complete the decrease in size of the inductor 51 (see FIG. 12E).

Although in this fifth embodiment, description was made of an example in which the size of the inductor is changed, the size of the other passive circuit device such as a transmission line, a capacitor or a coupler can be changed in all the same manner. This fifth embodiment can be applied to the above described first to third embodiments.

In such a fabricating method according to the fifth embodiment, a circuit pattern is changed only with respect to a portion where the change is required after the active device and the passive circuit device are first simultaneously formed. Accordingly, if the change is not required, the active device and the passive circuit device can be formed in a series of operations. In addition, if the change is not required, matching is good in its original state. Consequently, time required for fabrication is shortened, as compared with that in the first to third embodients, from the overall viewpoint of fabricating a lot of circuits.

Description is now made of the fabricating method according to the sixth embodiment of the present invention. In this sixth embodiment, an active device and a passive circuit device are first formed on a substrate and then, matching of both the devices is evaluated. If matching is unsuitable, characteristics of the active device formed are measured as in the above described fifth embodiment. The most suitable circuit pattern of the passive circuit device is calculated by simulation on the basis of the results of this measurement. A resist is selectively exposed to light using a direct drawing method with respect to only a portion, where the change is required, of the passive circuit device which has been already formed. Subsequently, etching is made if patterns must be decreased, while evaporation is performed, followed by lift-off if patterns must be added. This sixth embodiment can be applied to the above described first to third embodiments.

In such a fabricating method according to the sixth embodiment, actual matching of the active device and the passive circuit device formed is evaluated. Consequently, it is more certain that matching of both the devices in a semiconductor integrated circuit fabricated is good, as compared with the methods according to the above described first to fifth embodiments. In addition, if the matching evaluated is good, the change is not required. Accordingly, in such a case, the active device and the passive circuit device can be formed in a series of steps, as in the above described fifth embodiment, and operating time for fabrication can be shortened as a whole, as compared with the methods according to the first to third embodiments.

A fabricating method according to a seventh embodiment will be described with reference to FIG. 15.

A GaAs wafer 100 having HEMTs serving as a plurality of active devices formed thereon is mounted on a prober plate. Chips in the wafer 100 are probed by a DC prober 101. DC characteristics (Idss, gm, Vp, Vr, Vf, n or the like) of each of the chips are measured by a DC characteristic measuring system 102. The measured data is inputted to a DC measured data portion 103. The DC characteristic measuring system 102 comprises a semiconductor parameter analyzer, an impedance analyzer and the like. Data from the equipments are subjected to system and data collection and control by a control circuit comprising a computer, to output measured data. The DC measured data portion 103 stores inputted data on the DC characteristics of the chip. All chips which passed the DC standard out of the chips are communicated to an RF measuring system 105. The RF measuring system 105 causes an RF prober 104 to probe all the chips which passed the DC standard and measures characteristics such as a S parameter, a noise figure NF and gain Ga, to input the characteristics measured to a measured data portion 106.

The RF measuring system 106 comprises a network analyzer for measuring the S parameters of one-port and two-port networks, an NF meter for measuring the noise figure NF and the gain Ga, a synthesized sweeper for outputting power by sweeping the frequency, a tuner for matching an input with an output, a power meter, and the like. Data from the equipments are subjected to system and data collection and control by a control circuit comprising a computer, to output measured data. A microwave circuit simulation portion 107 simulates passive circuit devices on the basis of the results of measurement of the characteristics of each of the chips inputted and stored in the measured data portion 106. The microwave simulation portion 107 derives the shapes of a serial microstrip line, a parallel microstrip line, a shunt capacitor and a DC cut capacitor by simulation, as shown in FIG. 4. A circuit pattern of each of the chips obtained by this simulation is converted into CAD data in a CAD data generating portion 108, to input the same into an exposing apparatus control system 109. The exposing apparatus control system 109 draws circuit patterns respectively matched with the chips by making direct exposure (110) of a resist applied on the wafer 100 by irradiation of an electron beam or a focused ion beam.

The steps of the method of fabricating an MMIC according to the above described seventh embodiment of the present invention will be described with reference to FIG. 16. FIG. 16 is a cross-sectional view showing the MMIC in the steps.

As shown in FIG. 16A, an HEMT active layer (n+ GaAs/n GaAs/n+ AlGnAs) is first grown on a semi-insulated GaAs substrate 60 by an MBE process. The n+ GaAs, the n GaAs, and the n+ AlGaAs are respectively grown and formed to a size of $2 \times 10^{18}$ cm$^{-3}$: 200 Å thick, a size of $5 \times 10^{17}$ cm$^{-3}$: 500 Å thick, and a size of $2 \times 10^{18}$ cm$^{-3}$: 500 Å thick by the MBE process.

As shown in FIG. 16B, mesa etching is then made at a depth of 1.5 μm using a photoresist (for example, OMR-83 made of Tokyo Ohka Kogyo Corporation) for the purpose of isolation. An etchant used in this etching is a combined solution of a sodium hydroxide solution and hydrogen peroxide.

Subsequently, as shown in FIG. 16C, an ohmic electrode 62 is formed in an HEMT portion and a resistance portion by a lift-off process using, for example, an LMR resist made of Fuji Yakuhin Kogyo Corporation. A metal to be deposited is Au. Ge (800 Å)/Ni (100 Å)/Au (2000 Å) and is coated with an ohmic alloy at a temperature of 420° C. for 90 seconds after being lifted off. At this time point, the fabrication of the resistance portion is almost completed, so that ohmic characteristics can be found.

Furthermore, as shown in FIG. 16D, a schottky electrode is formed in the HEMT portion, to be a gate electrode 63. First, a resist OEBR-1000M made of Tokyo Ohka Kogyo Corporation is applied to a thickness of 1 μm, to obtain a width pattern of 0.4 μm using deep UV (ultraviolet) light. Recess etching is made such that a desired Idss value is obtained. An etchant is a combined solution of phosphoric acid, hydrogen peroxide and water. The etching is made herein such that the thickness of the remaining film becomes approximately 350 Å. Thereafter, Ti 500 Å thick/Al 6000 Å thick is formed as an electrode material by electron beam evaporation, to be lifted off.

An S parameter and a noise parameter in the HEMT portion are measured on the wafer using the RF prober. Numerical values and pattern shapes of a microstrip line and an MIM capacitance required to obtain desired MMIC characteristics are determined from simulation on the basis of the results of this measurement.

As shown in FIG. 16E, if the pattern shapes are determined, patterns of the microstrip line 65 and a lower metal layer 64 of the MIM capacitance are formed. In this pattern formation, the lift-off process using an electron beam resist is employed so as to make an electron beam a resist applied on the substrate. The metal layers 64 and 65 are Ti 1000 Å thick/Pd 2000 Å thick/Au 3000 Å thick. Thereafter, the metal layers are passivated by an SIN film 66 having a thickness of 2000 Å.

Finally, as shown in FIG. 16F, an upper metal layer 67 of the MIM capacitance is formed in the same manner as described above. In addition, a microstrip line portion is subjected to gold plating 68 so as to reduce the loss thereof. Consequently, an MMIC comprising an HEMT 70, an MIM capacitance 71, a resistance 72 and a microstrip line 73 is formed.

Although in the above described embodiments, a circuit pattern of a passive circuit device is calculated by simulation based on the results of measurement of characteristics of each active device formed, good matching of both the devices may, in some cases, be unable to be obtained. The reason is that the effect of the thickness of a substrate such as a GaAs substrate becomes a problem. More specifically, even in the same circuit pattern, the characteristic impedance differs depending on the thickness of the substrate. In addition, when a via hole is used, the grounding conditions differ depending on the thickness of the substrate, which affects characteristics of a short stub or the like.

Figure 13:
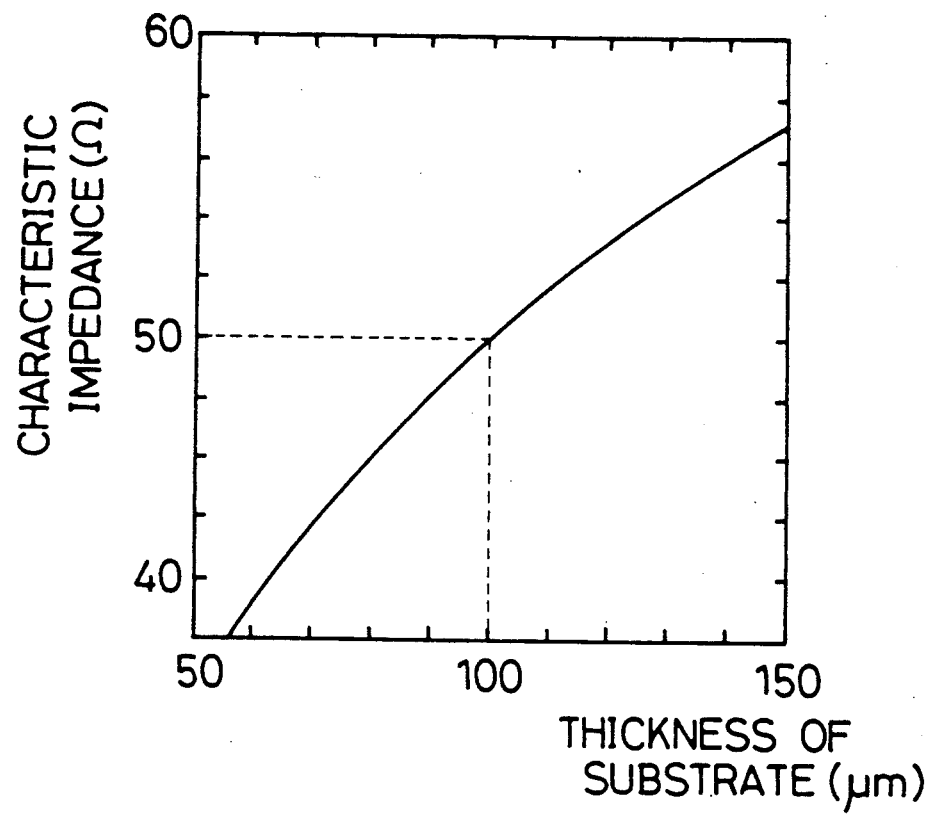
FIG. 13 is a graph showing the relation between the thickness of a substrate and the characteristic impedance in a microstrip line.

Description is now made of the effect of the thickness of a substrate in circuit characteristics. A microstrip line is formed on a GaAs substrate (the dielectric constant $\epsilon r = 12.5$). FIG. 13 shows the relation between the thickness ($\mu$m) of the GaAs substrate and the characteristic impedance ($\Omega$) in a case where the width (72.3 $\mu$m) of this line is fixed. For example, when the thickness of the GaAs substrate is 100 $\mu$m, the characteristic impedance is approximately 50$\Omega$. If the thickness of the substrate is changed by approxiamtely $\pm 50\%$, however, the characteristic impedance is changed by approximately 10$\Omega$.

Figure 14:
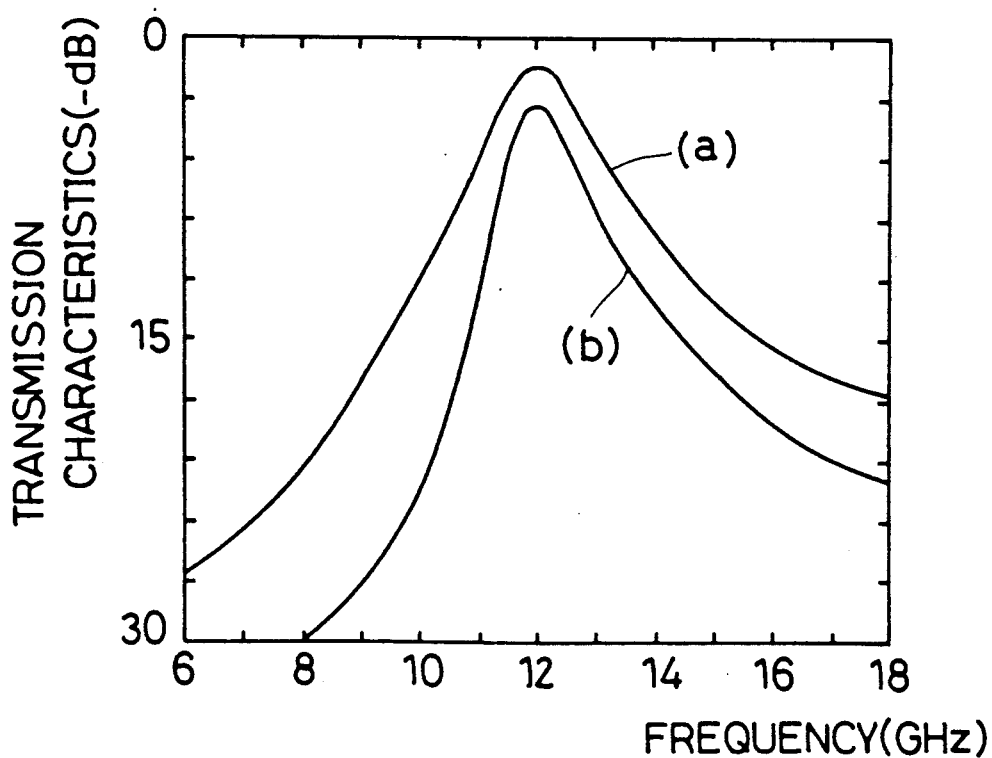
FIG. 14 is a graph showing the relation between the thickness of a substrate and characteristics of a band-pass filter.

Furthermore, FIG. 14 shows characteristics of a band-pass filter designed on a GaAs substrate. In FIG. 14, (a) indicates a case where the thickness of the GaAs substrate is 120 $\mu$m, and (b) indicates a case where the thickness of the GaAs substrate is 80 $\mu$m. From the results shown in FIG. 14, it will be understood that characteristics such as the Q value or the transmission loss of the band-pass filter are greatly varied if the thickness of the substrate is changed.

In general, a substrate remains thick in consideration of the operating performance at the time of forming devices. In an MMIC, however, the thickness of the substrate must be decreased so as to allow an operation in a microwave region due to the problem in compactness or characteristics. During the fabricating processes of the MMIC, therefore, the reverse side of the substrate is generally etched after forming an active device. Consequently, even in the same wafer, the thickness of the substrate may be varied. Alternatively, the wall thickness of the entire wafer may be reduced. In the actual fabricating processes, the error of the thickness of the substrate is approximately $\pm 20$ $\mu$m.

As described in the foregoing, the variation in thickness of the substrate occurs in the fabricating processes. In addition, this variation greatly affects circuit characteristics as described above. Accordingly, a circuit pattern of a passive circuit device must be calculated by simulation based on not only characteristics of the active device but also the thickness of the substrate.

Devised from such circumstances is a fabricating method according to an eighth embodiment of the present invention. In this method, characteristics of an active device formed as well as the thickness of a substrate are measured, the circuit pattern of a passive circuit device is calculated by simulation based on both data obtained, and the circuit pattern is directly drawn on a resist depending on this circuit pattern.

It goes without saying that this eighth embodiment can be applied to the above described first, second, third, fourth, fifth, sixth and seventh embodiments.

In such a fabricating method according to the eighth embodiment, simulation is achieved in consideration of the thickness. Accordingly, in each of the fabricating methods according to the above described first, second, third, fourth, fifth, sixth and seventh embodiments to which this eighth embodiment is applied, yield can be further improved, as compared with each of the first, second, third, fourth, fifth, sixth and seventh embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor integrated circuit having an active device and a passive circuit device on a substrate, comprising the steps of:
   forming said active device on said substrate;
   measuring DC characteristics and high frequency characteristics of said active device formed so as to provide results;
   simulating a circuit pattern of said passive circuit device so as to obtain simulated characteristics of said passive circuit on the basis of the results of the step of measuring; and
   directly drawing said circuit pattern on said substrate to form said passive circuit device based on said simulated characteristics obtained from the step of simulating.

2. The method according to claim 1, wherein the step of measuring includes measuring the thickness of said substrate as part of the results, the step of simulating including obtaining said simulated characterisitcs of said passive circuit based on the results of the step of measuring which includes the measured thickness of said substrate, the step of directly drawing including drawing said circuit pattern on said substrate based on said simulated characteristics which include the measured thickness of said substrate.

3. The method according to claim 1, wherein said integrated circuit comprises a uniplanar monolithic microwave integrated circuit.

4. The method according to claim 3, wherein said passive circuit device comprises a coplanar line.

5. A method of fabricating a semiconductor integrated circuit having an active device and a passive circuit device on a substrate, comprising the steps of:
   forming said active device and said passive circuit device on said substrate;
   measuring characteristics of said active device formed; and
   selecting the most suitable circuit pattern out of a plurality of circuit patterns of the passive circuit device previously designed on the basis of the measured characteristics and directly drawing the selected most suitable circuit pattern on said substrate to form said passive circuit device.

6. The method according to claim 5, wherein the step of measuring includes measuring the thickness of said substrate as part of the measured characteristics, the step of selecting including selecting on the basis of the measured characteristics which include the measured thickness of said substrate.

7. The method according to claim 5, wherein said integrated circuit comprises a uniplanar monolithic microwave integrated circuit.

8. The method according to claim 7, wherein said passive circuit device comprises a coplanar line.

9. A method of fabricating a semiconductor integrated circuit having an active device and a passive circuit device on a substrate, comprising the steps of:

forming said active device and said passive circuit device on said substrate;

measuring characteristics of said active device formed;

simulating a circuit pattern of said passive circuit device on the basis of the measured characteristics;

comparing the circuit pattern obtained by the step of simulating with a circuit pattern of said passive circuit device which has already formed on said substrate so as to determine a portion to be changed; and directly drawing the circuit pattern obtained by said step of simulating on said substrate with respect to said portion to be changed to form said passive circuit device.

10. The method according to claim 9, wherein the step of measuring includes measuring the thickness of said substrate as part of the measured characteristics, the step of simulating including simulating on the basis of the measured characteristics which include the measured thickness of said substrate.

11. The method according to claim 9, wherein said integrated circuit comprises a uniplanar monolithic microwave integrated circuit.

12. The method according to claim 11, wherein said passive circuit device comprises a coplanar line.

13. A method of fabricating a semiconductor integrated circuit having an active device and a passive circuit device on a substrate, comprising the steps of:

forming said active device and said passive circuit device on said substrate;

evaluating matching of both of the devices formed;

measuring characteristics of said active device formed when the matching is poor as a result of the step of evaluating;

simulating a circuit pattern of said passive circuit device on the basis of the measured characteristics from the step of measuring;

comparing the circuit pattern obtained from the step of simulating with the circuit pattern of said passive circuit device which has been already formed on said substrate to determine a portion to be changed; and directly drawing the circuit pattern obtained by said step of simulating on said substrate with respect to this portion to be changed to form said passive circuit device.

14. The method according to claim 13, wherein the step of measuring includes measuring the thickness of said substrate as part of the characteristics which are measured, the step of simulating including simulating on the basis of the measured characteristics which include the measured thickness of said substrate.

15. The method according to claim 13, wherein said integrated circuit comprises a uniplanar monolithic microwave integrated circuit.

16. The method according to claim 15, wherein said passive circuit device comprises a coplanar line.

17. A method of fabricating a semiconductor integrated circuit having a plurality of active devices and passive circuit devices on a substrate, comprising the steps of:

forming said active devices on said substrate;

first measuring DC characteristics of each of said active devices formed to provide results;

second measuring characteristics such as S parameters, noise figures NF and gain Ga of all active devices conforming to the DC characteristic standard based on the results from the step of first measuring;

simulating circuit patterns of said passive circuit devices so as to obtain simulated characteristics of said passive circuits on the basis of the measured characteristics from the step of second measuring;

determining a desired circuit pattern for each of said active devices on the basis of the simulated characteristics; and drawing said desired circuit pattern on a resist applied on said substrate to form each of said passive circuit devices.

18. The method according to claim 17, wherein the step of first measuring includes measuring the thickness of said substrate as part of the results, the step of second measuring including measuring the characteristics based on the results which include the measured thickness of said substrate.

19. The method according to claim 17, wherein said integrated circuit comprises a uniplanar monolithic microwave integrated circuit.

20. The method according to claim 19, wherein each of said passive circuit devices comprises a coplanar line.

* * * * *